(12) United States Patent
Yug

(10) Patent No.: US 11,672,161 B2
(45) Date of Patent: Jun. 6, 2023

(54) METHOD OF MANUFACTURING DISPLAY APPARATUS

(71) Applicant: Samsung Display Co., Ltd., Yongin-si (KR)

(72) Inventor: Geunwoo Yug, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 97 days.

(21) Appl. No.: 16/704,732

(22) Filed: Dec. 5, 2019

(65) Prior Publication Data

US 2020/0203671 A1 Jun. 25, 2020

(30) Foreign Application Priority Data

Dec. 24, 2018 (KR) .......................... 10-2018-0168716

(51) Int. Cl.
| | | |
|---|---|---|
| *B23K 26/082* | (2014.01) | |
| *H01L 51/56* | (2006.01) | |
| *H01L 27/32* | (2006.01) | |
| *H01L 51/00* | (2006.01) | |
| *B23K 26/384* | (2014.01) | |
| *H01L 51/52* | (2006.01) | |

(52) U.S. Cl.
CPC ............ *H01L 51/56* (2013.01); *B23K 26/082* (2015.10); *B23K 26/384* (2015.10); *H01L 27/3244* (2013.01); *H01L 51/0096* (2013.01); *H01L 51/5253* (2013.01); *H01L 2227/323* (2013.01)

(58) Field of Classification Search
CPC . H01L 51/56; H01L 51/0096; H01L 51/5253; H01L 2227/323; H01L 27/3244; H01L 27/3225; H01L 51/0014; H01L 51/5237; H01L 2251/56; B23K 26/384; B23K 26/082; Y02D 10/549; Y02P 70/50; Y20P 70/50

See application file for complete search history.

(56) References Cited

U.S. PATENT DOCUMENTS

| | | | |
|---|---|---|---|
| 9,303,778 B2 | 4/2016 | Walker | |
| 9,688,094 B2 | 6/2017 | Jeong et al. | |
| 10,121,842 B2 | 11/2018 | Lee et al. | |
| 10,280,108 B2 * | 5/2019 | Bohme | ................. B23K 26/53 |

(Continued)

FOREIGN PATENT DOCUMENTS

| | | |
|---|---|---|
| JP | 2014-49518 A | 3/2014 |
| KR | 10-1241936 B1 | 3/2013 |

(Continued)

*Primary Examiner* — Caridad Everhart
(74) *Attorney, Agent, or Firm* — Lewis Roca Rothgerber Christie LLP

(57) ABSTRACT

A method of manufacturing a display apparatus includes: forming a plurality of display devices in a display area of a substrate including an opening area and the display area surrounding the opening area; and forming an opening in the opening area, wherein the forming of the opening includes: performing a first scan operation, whereby a laser beam is irradiated onto an edge of the opening area in a direction of the substrate along a plurality of first unit paths; and performing a second scan operation, whereby the laser beam is irradiated onto the edge of the opening area in the direction of the substrate along a plurality of second unit paths that are different from the plurality of first unit paths.

20 Claims, 6 Drawing Sheets

(56) References Cited

U.S. PATENT DOCUMENTS

| | | | | |
|---|---|---|---|---|
| 2004/0263506 | A1* | 12/2004 | Koyama | G09G 3/3225 |
| | | | | 345/204 |
| 2008/0067157 | A1* | 3/2008 | Morikazu | B23K 26/0853 |
| | | | | 219/121.71 |
| 2008/0179302 | A1* | 7/2008 | Morikazu | B23K 26/0734 |
| | | | | 219/121.71 |
| 2016/0318122 | A1* | 11/2016 | Ota | B23K 26/0624 |
| 2020/0106054 | A1* | 4/2020 | Boroson | H01L 51/524 |
| 2021/0098722 | A1* | 4/2021 | Ma | H05K 1/0393 |

FOREIGN PATENT DOCUMENTS

| | | |
|---|---|---|
| KR | 10-1425492 B1 | 8/2014 |
| KR | 10-2015-0045759 A | 4/2015 |
| KR | 10-2015-0123797 A | 11/2015 |
| KR | 10-2016-0080310 A | 7/2016 |

\* cited by examiner

METHOD OF MANUFACTURING DISPLAY APPARATUS

CROSS-REFERENCE TO RELATED APPLICATION

This application claims priority to and the benefit of Korean Patent Application No. 10-2018-0168716, filed on Dec. 24, 2018, in the Korean Intellectual Property Office, the disclosure of which is incorporated herein in its entirety by reference.

BACKGROUND

1. Field

Aspects of one or more embodiments relate to a method of manufacturing a display apparatus.

2. Description of the Related Art

With the rapid development in the field of display technology for visually or graphically representing various electrical signal information, a wide range of flat panel display apparatuses having excellent characteristics, such as thinness, lightness, and low power consumption, have been researched and developed. For example, an organic light-emitting display apparatus, which is a self-emitting type display apparatus, generally not requiring a separate light source or backlight, may be driven by a relatively low voltage and formed with a relatively thin and light structure, while having superior characteristics, such as a wide angle of view, a high contrast, a high response rate, etc. Thus, the organic light-emitting display apparatus has drawn attention as a next generation display apparatus.

Recently, the range of use of the display apparatuses has been steadily increased, as the display weight has reduced and sizes have become more compact.

Various functions may be added to a display apparatus while increasing a ratio of a display area to a general or overall area of the display apparatus. For example, a display apparatus having a display area including an opening may be formed according to some example embodiments.

The above information disclosed in this Background section is only for enhancement of understanding of the background and therefore it may contain information that does not constitute prior art.

SUMMARY

Aspects of one or more embodiments relate to a method of manufacturing a display apparatus, and for example, to a method of manufacturing a display apparatus, the method being capable of reducing damage to a process region and improving a production yield rate and a production quantity.

In the case of a display apparatus including an opening, a method of implementing a delay time after a single process operation may be used in order to reduce damage to a process region when forming the opening by using a laser beam operation. However, when the delay times are increased, a production yield rate and a production quantity may decrease.

According to some example embodiments, in a method of manufacturing a display apparatus, the method may be capable of reducing damage to a process region and improving a production yield rate and a production quantity.

Additional aspects will be set forth in part in the description which follows and, in part, will be apparent from the description, or may be learned by practice of the presented example embodiments.

According to some example embodiments, in a method of manufacturing a display apparatus, the method includes: forming a plurality of display devices in a display area of a substrate including an opening area and the display area surrounding the opening area; and forming an opening in the opening area, wherein the forming of the opening includes: performing a first scan operation, whereby a laser beam is irradiated onto an edge of the opening area in a direction of the substrate along a plurality of first unit paths; and performing a second scan operation, whereby the laser beam is irradiated onto the edge of the opening area in the direction of the substrate along a plurality of second unit paths that are different from the plurality of first unit paths.

According to some example embodiments, the forming of the opening may include alternately and repeatedly performing the first scan operation and the second scan operation.

According to some example embodiments, in at least one of the first scan operation or the second scan operation, a point in time in which the irradiation of the laser beam along a previous unit path of neighboring unit paths is completed may be different from a point in time in which the irradiation of the laser beam along a next unit path of the neighboring unit paths is started.

According to some example embodiments, each of the plurality of first unit paths and the plurality of second unit paths may have at least a portion overlapping the edge of the opening area.

According to some example embodiments, the plurality of first unit paths and the plurality of second unit paths may have the same shape.

According to some example embodiments, a point in which neighboring first unit paths among the plurality of first unit paths cross each other may pass through a vertical bisectional line of a second unit path among the plurality of second unit paths, the second unit path being located between the neighboring first unit paths.

According to some example embodiments, at least one of the plurality of first unit paths or the plurality of second unit paths may have an arc shape.

According to some example embodiments, at least one of the plurality of first unit paths or the plurality of second unit paths may have at least a portion having a bent shape.

According to some example embodiments, at least one of the plurality of first unit paths or the plurality of second unit paths may include at least two unit paths having different lengths from each other.

According to some example embodiments, the forming of the opening may further include performing a third scan operation, whereby the laser beam is irradiated onto the edge of the opening area in the direction of the substrate along a plurality of third unit paths that are different from the plurality of first unit paths and the plurality of second unit paths.

According to some example embodiments, the method may further include forming a thin film encapsulation layer on the substrate to cover the plurality of display devices.

According to some example embodiments, the forming of the opening may include forming the opening to penetrate the substrate and the thin film encapsulation layer in a thickness direction of the substrate.

According to some example embodiments, the forming of the plurality of display devices may include forming a pixel circuit including a thin film transistor, forming a pixel electrode electrically connected to the thin film transistor, and forming an emission layer on the pixel electrode and an opposite electrode on the emission layer.

According to some example embodiments, in a method of manufacturing a display apparatus, the method includes: forming a plurality of display devices in a display area of a substrate including an opening area and the display area surrounding the opening area; and forming an opening in the opening area, wherein the forming of the opening in the opening area includes: repeatedly performing a first scan operation n times, whereby a laser beam is irradiated onto an edge of the opening area in a direction of the substrate along n (n is a natural number equal to or greater than 2) first unit paths; and repeatedly performing a second scan operation n times, whereby the laser beam is irradiated onto the edge of the opening in the direction of the substrate along n second unit paths that are different from the n first unit paths.

According to some example embodiments, the forming of the opening in the opening area may include alternately and repeatedly performing the first scan operation and the second scan operation.

According to some example embodiments, in at least one of the first scan operation or the second scan operation, a point in time in which the irradiation of the laser beam along a previous unit path of neighboring unit paths is completed may be different from a point in time in which the irradiation of the laser beam along a next unit path of the neighboring unit paths is started.

According to some example embodiments, each of the n first unit paths and the n second unit paths may have at least a portion overlapping the edge of the opening area.

According to some example embodiments, the n first unit paths and the n second unit paths may have the same shape.

According to some example embodiments, at least one of the n first unit paths for the n second unit paths may include at least two unit paths having different lengths from each other.

According to some example embodiments, the forming of the opening may further include performing a third scan operation, whereby the laser beam is irradiated onto the edge of the opening area in the direction of the substrate along n third unit paths that are different from the n first unit paths and the n second unit paths.

BRIEF DESCRIPTION OF THE DRAWINGS

These and/or other aspects will become more apparent and more readily appreciated from the following description of the embodiments, taken in conjunction with the accompanying drawings in which.

DETAILED DESCRIPTION

Figure 1:
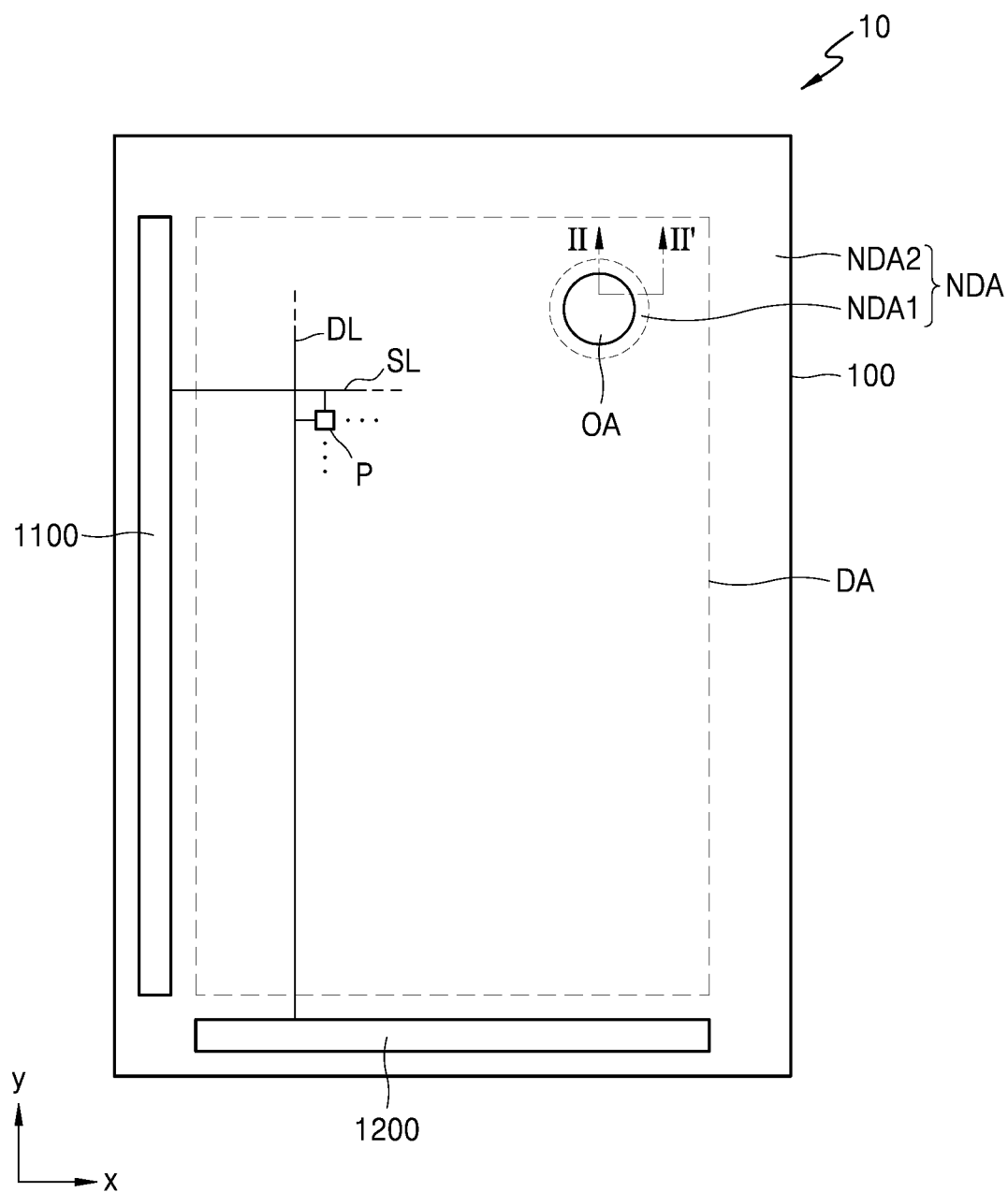
FIG. 1 is a schematic plan view of a display apparatus manufactured by using a method of manufacturing a display apparatus according to some example embodiments.

As the present disclosure allows for various changes and numerous embodiments, aspects of some example embodiments will be illustrated in the drawings and described in some detail in the written description. However, the example embodiments are not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain detailed explanations of related art may be omitted when it is deemed that they may unnecessarily obscure the essence of the present disclosure.

It will be understood that although the terms "first," "second," etc. may be used herein to describe various components, these components should not be limited by these terms. These components are only used to distinguish one component from another.

It will be understood that when a layer, region, or component is referred to as being formed "above" or "on" another layer, region, or component, it can be "directly" or indirectly formed "on" the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, reference will now be made in more detail to embodiments, examples of which are illustrated in the accompanying drawings, wherein like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list. Sizes of elements in the drawings may be exaggerated for convenience of explanation. In other words, because sizes and thicknesses of components in the drawings are arbitrarily illustrated for convenience of explanation, the following embodiments are not limited thereto.

Figure 2:
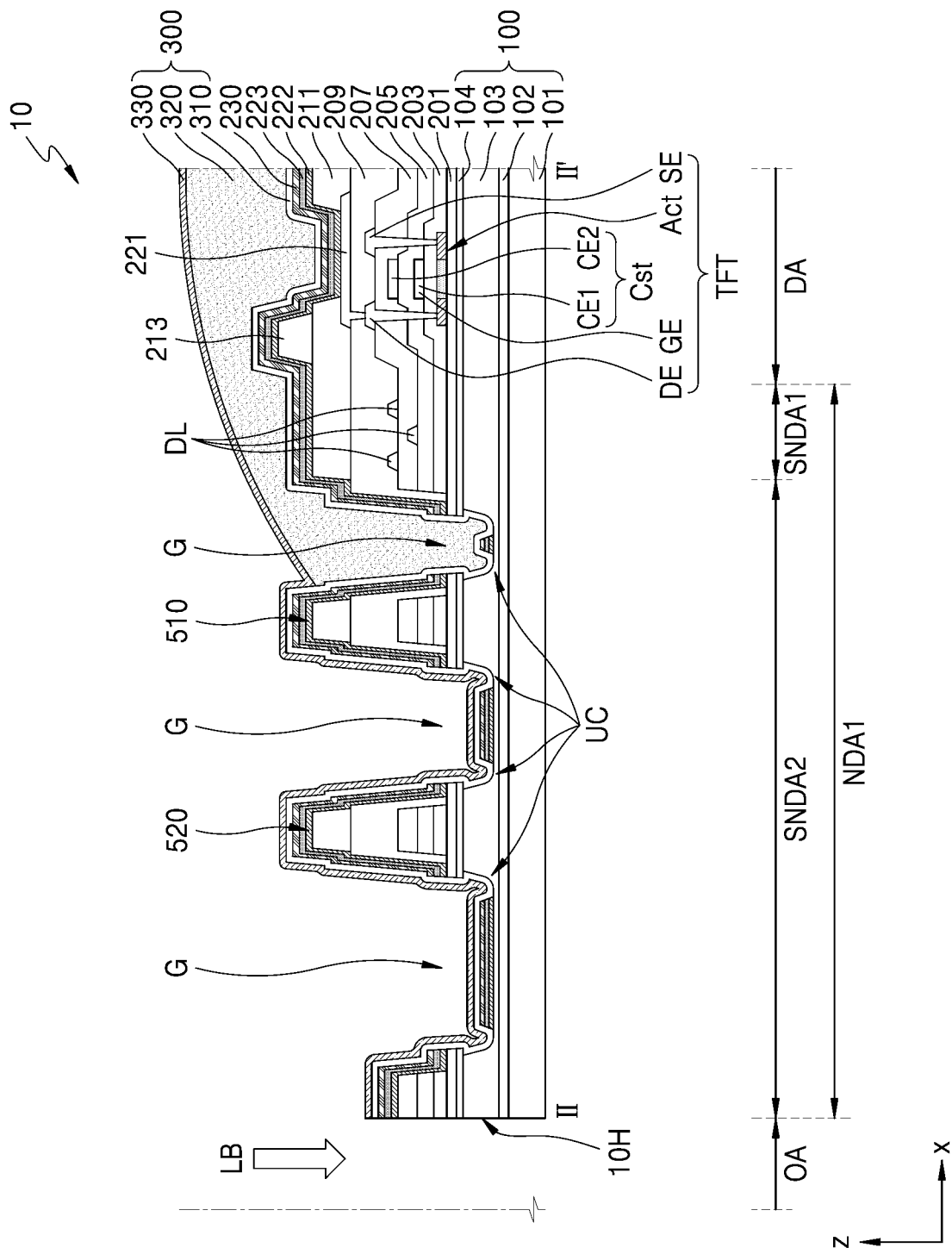
FIG. 2 is an example cross-sectional view taken along a line II-II' of FIG. 1.

FIG. 1 is a schematic plan view of a display apparatus 10 manufactured by using a method of manufacturing a display apparatus according to some example embodiments and FIG. 2 is an example cross-sectional view taken along a line II-II' of FIG. 1.

First, referring to FIG. 1, the display apparatus 10 may include a display area DA for emitting light and a non-display area NDA for not emitting light. The non-display area NDA may be arranged to be adjacent to the display area DA. The display apparatus 10 may provide or display a certain image by using light emitted from a plurality of pixels P arranged in the display area DA.

The display apparatus 10 may include an opening area OA at least partially surrounded by the display area DA. FIG. 1 illustrates that the opening area OA is completely surrounded by the display area DA, according to some example embodiments. The non-display area NDA may include a first non-display area NDA1 surrounding the opening area OA and a second non-display area NDA2 surrounding the exterior of the display area DA. The first non-display area NDA1 may substantially surround the opening area OA, the display area DA may substantially surround the first non-display area NDA1, and the second non-display area NDA2 may substantially surround the display area DA.

Hereinafter, an organic light-emitting display apparatus will be described as an example of the display apparatus 10 according to some example embodiments. However, display apparatuses according to the present disclosure are not limited thereto. According to some example embodiments, various types of display apparatuses, such as an inorganic light-emitting display, a quantum dot light-emitting display, etc., may be used.

Next, referring to FIG. 2, the display apparatus 10 may include the opening area OA, the display area DA, and the first non-display area NDA1 between the opening area OA and the display area DA. The display apparatus 10 may include a first opening 10H corresponding to the opening area OA.

With respect to the display area DA illustrated in FIG. 2, a thin film transistor TFT and a storage capacitor Cst may be arranged on a substrate 100 in the display area DA.

The substrate 100 may include multiple layers. For example, the substrate 100 may include a first base layer 101, a first barrier layer 102, a second base layer 103, and a second barrier layer 104 that are sequentially stacked.

Each of the first and second base layers 101 and 103 may include polymer resins. For example, the first and second base layers 101 and 103 may include polymer resins, such as polyethersulphone, polyarylate, polyetherimide, polyethylene naphthalate, polyethylene terephthalate, polyacrylate, polyphenylene sulfide, polyimide, polycarbonate, cellulose tri-acetate, cellulose acetate propionate, etc. The polymer resins described above may be transparent.

Each of the first and second barrier layers 102 and 104 may include a barrier layer preventing penetration of external impurities and may include a single layer or multiple layers including an inorganic material, such as silicon nitride ($SiN_x$) and/or silicon oxide ($SiO_x$).

However, the substrate 100 is not limited thereto. The substrate 100 may include a rigid substrate including glass, reinforced plastic resins, or the like.

A buffer layer 201 may be formed on the substrate 100 to prevent or reduce instances of impurities penetrating into a semiconductor layer Act of the thin film transistor TFT. The buffer layer 201 may include an inorganic insulating material, such as $SiN_x$ or $SiO_x$, and may include a single layer or multiple layers including the inorganic insulating material described above.

A pixel circuit including the thin film transistor TFT and the storage capacitor Cst may be arranged on the buffer layer 201.

The thin film transistor TFT may include the semiconductor layer Act, a gate electrode GE, a source electrode SE, and a drain electrode DE. The thin film transistor TFT illustrated in FIG. 2 may correspond to a driving thin film transistor. According to some example embodiments, a top gate-type transistor in which the gate electrode GE is arranged on the semiconductor layer Act with a gate insulating layer 203 therebetween is illustrated. However, according to some example embodiments, the thin film transistor TFT may be a bottom gate-type transistor.

The semiconductor layer Act may include polysilicon. Alternatively, the semiconductor layer Act may include amorphous silicon, an oxide semiconductor, an organic semiconductor, or the like. The gate electrode GE may include a low resistive metal material. The gate electrode GE may include a conductive material, such as Mo, Al, Cu, Ti, etc., and may include a single layer or multiple layers including the above materials.

The gate insulating layer 203 between the semiconductor layer Act and the gate electrode GE may include an inorganic insulating material, such as $SiO_x$, $SiN_x$, silicon oxide nitride (SiON), aluminum oxide, titanium oxide, tantalum oxide, and hafnium oxide. The gate insulating layer 203 may include a single layer or multiple layers including the above materials.

The source electrode SE and the drain electrode DE may include a material having good conductivity. The source electrode SE and the drain electrode DE may include a conductive material, such as Mo, Al, Cu, Ti, etc., and may include a single layer or multiple layers including the above materials. According to some example embodiments, the source electrode SE and the drain electrode DE may include multiple layers of Ti/Al/Ti.

The storage capacitor Cst may include a lower electrode CE1 and an upper electrode CE2 overlapping each other with a first interlayer insulating layer 205 therebetween. The storage capacitor Cst may overlap the thin film transistor TFT. In relation to this, FIG. 2 illustrates that the gate electrode GE of the thin film transistor TFT corresponds to the lower electrode CE1 of the storage capacitor Cst. According to some example embodiments, the storage capacitor Cst may not overlap the thin film transistor TFT.

A pixel electrode 221, an intermediate layer 222, an opposite electrode 223, and a capping layer 230 that are electrically connected to the thin film transistor TFT may be arranged in the display area DA. Insulating layers 201, 203, 205, 207, and 209 may be arranged between the semiconductor layer Act of the thin film transistor TFT and the pixel electrode 221 and between the upper and lower electrodes CE1 and CE2 of the storage capacitor Cst.

The pixel electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to some example embodiments, the pixel electrode 221 may include a reflective layer including Ag, Mg, Al, Pt, Pd, Au, Ni, Nd, Ir, Cr, or a compound thereof. According to some example embodiments, the pixel electrode 221 may further include a layer including ITO, IZO, ZnO or $In_2O_3$, above/below the reflective layer described above.

A pixel-defining layer 211 may be formed on the pixel electrode 221. The pixel-defining layer 211 may include an opening exposing an upper surface of the pixel electrode 221 and may cover an edge of the pixel electrode 221. The pixel-defining layer 211 may include an organic insulating material or an inorganic insulating material, or may include an organic insulating material and an inorganic insulating material.

The intermediate layer 222 may include an emission layer. The emission layer may include a high molecular-weight organic material or a low molecular-weight organic material emitting light of a certain color. The intermediate layer 222 may include various functional layers having various functions, above or below the emission layer.

The opposite electrode 223 may include a conductive material having a low work function. For example, the opposite electrode 223 may include a (half) transparent layer including Ag, Mg, Al, Pt, Pd, Au, Ni, Nd, Ir, Cr, Li, Ca, or an alloy thereof. Alternatively, the opposite electrode 223 may further include a layer, such as ITO, IZO, ZnO, or $In_2O_3$, on the (half) transparent layer including the materials described above. The opposite electrode 223 may be formed not only in the display area DA but also in the first non-display area NDA1. The intermediate layer 222 and the opposite electrode 223 may be formed by using heat deposition.

A display device including the pixel electrode 221, the intermediate layer 222, and the opposite electrode 223 may be covered by a thin film encapsulation layer 300. The thin film encapsulation layer 300 may include at least one organic encapsulation layer and at least one inorganic encapsulation layer. FIG. 2 illustrates that the thin film encapsulation layer 300 includes a first inorganic encapsulation layer 310, a second inorganic encapsulation layer 330, and an organic encapsulation layer 320 therebetween. According to some example embodiments, the number of organic encapsulation layers, the number of inorganic encapsulation layers, and an order of stack of the inorganic encapsulation layers and the organic encapsulations may be changed.

The first inorganic encapsulation layer 310 may include at least one inorganic insulating material, such as aluminum oxide, titanium oxide, tantalum oxide, hafnium oxide, zinc oxide, $SiO_x$, $SiN_x$, or SiON, and may be formed by chemical vapor deposition (CVD), etc. The organic encapsulation layer 320 may include a polymer-based material. The polymer-based material may include an acryl-based resin, an epoxy-based resin, polyimide, polyethylene, etc.

With respect to the first non-display area NDA1 illustrated in FIG. 2, the first non-display area NDA1 may include a first sub-non-display area SNDA1, which is relatively adjacent to the display area DA, and a second sub-non-display area SNDA2 which is relatively adjacent to the opening area OA or the first opening 10H.

The first sub-non-display area SNDA1 may be an area through which signal lines (DL, SL, etc. of FIG. 1), for example, the data lines DL pass. The data lines DL illustrated in FIG. 2 may correspond to the data lines bypassing the opening area (OA of FIG. 1). The first sub-non-display area SNDA1 may be a wiring area through which the data lines DL and the scan lines (SL of FIG. 1) pass or a bypassing area of the data lines DL and the scan lines (SL of FIG. 1).

The data lines DL may be alternately arranged with an insulating layer therebetween, as illustrated in FIG. 2. Alternatively, according to some example embodiments, the data lines DL may be arranged on the same insulating layer. When neighboring data lines DL are arranged above and below each other with an insulating layer (for example, the second interlayer insulating layer 207) therebetween, a gap (pitch) between the neighboring data lines DL may be reduced, and thus, a width of the first non-display area NDA1 may be reduced. Likewise, according to some example embodiments, the scan lines (SL of FIG. 1) may be arranged on a different layer from the data lines DL in the first sub-non-display area SNDA1. For example, the scan lines (SL of FIG. 1) may be located on the first interlayer insulating layer 205.

The second sub-non-display area SNDA2 may be a groove area in which grooves are arranged. FIG. 2 illustrates three grooves located in the second sub-non-display area SNDA2. The grooves G may be formed in a multiple layer including a first layer and a second layer including different materials from each other. As illustrated in FIG. 2, according to some example embodiments, the grooves G may be formed to be adjacent to the first opening 10H of the substrate 100.

The groove G may include an undercut portion UC which is concave in a thickness direction of the substrate 100, that is, a−z direction. Based on the undercut portion UC, some functional layers included in the intermediate layer 222 formed throughout the display area DA and the first non-display area NDA1, and the opposite electrode 233 may be short-circuited, thereby resolving or preventing issues with water penetration into the display area DA through a process surface of the first opening 10H.

Meanwhile, in the process of forming the first opening 10H by using a laser beam LB, thermal damage or cracks may occur in the process region. For example, a detachment defect may occur, whereby an interface surface of the display device including the pixel circuit including the thin film transistor TFT and the storage capacitor Cst, the pixel electrode 221, the intermediate layer 222, and the opposite electrode 223, and an interface surface of the thin film encapsulation layer 300 covering the display device are detached from each other.

Hereinafter, with reference to FIGS. 3 through 6, a method of forming the first opening 10H in the opening area OA of the substrate 100 by using the laser beam LB while reducing the thermal damage or the cracks described above will be described in more detail.

Figure 3:
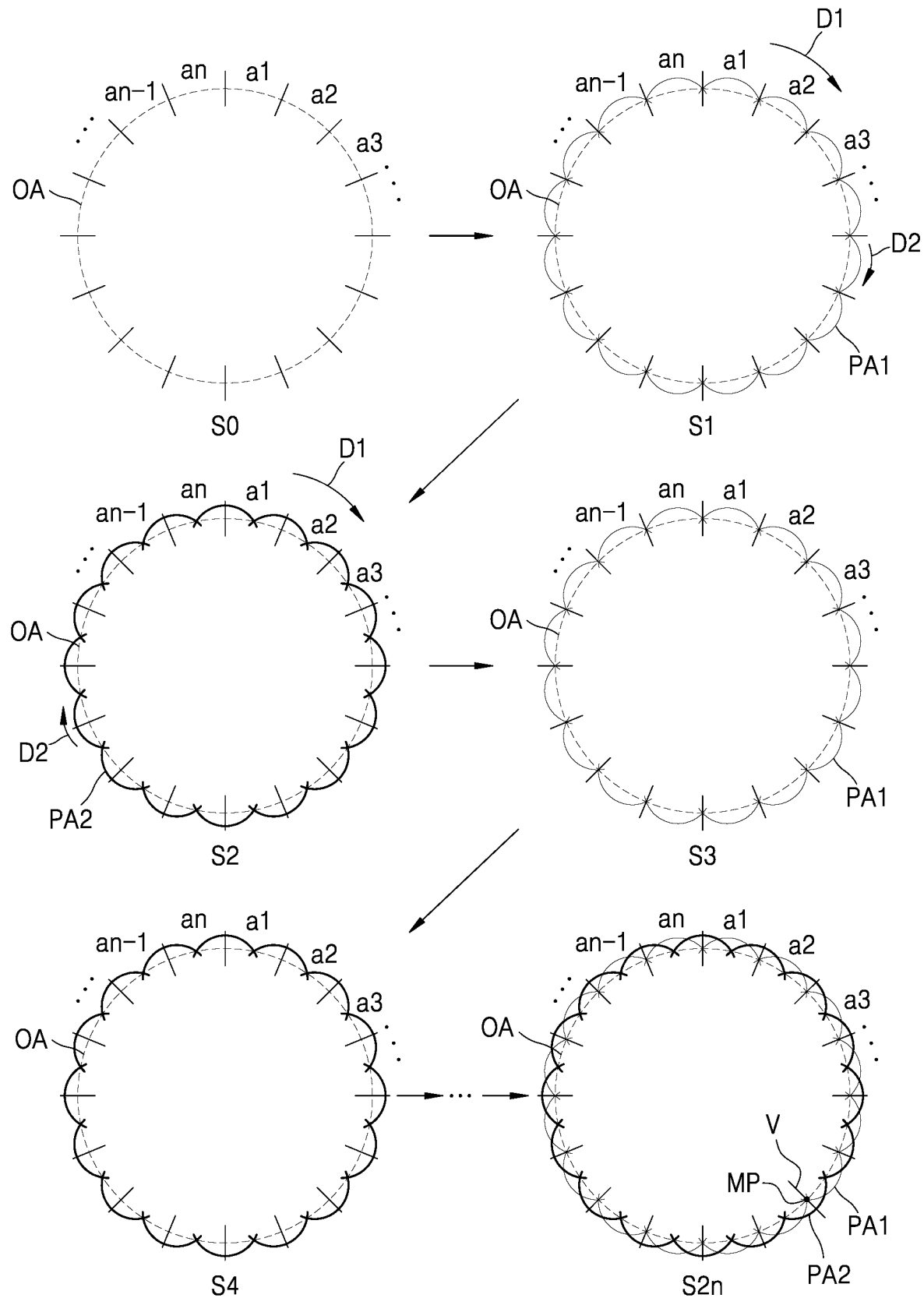
FIG. 3 is a schematic view of an example of processes of manufacturing a display apparatus, according to some example embodiments.
Figure 4A:
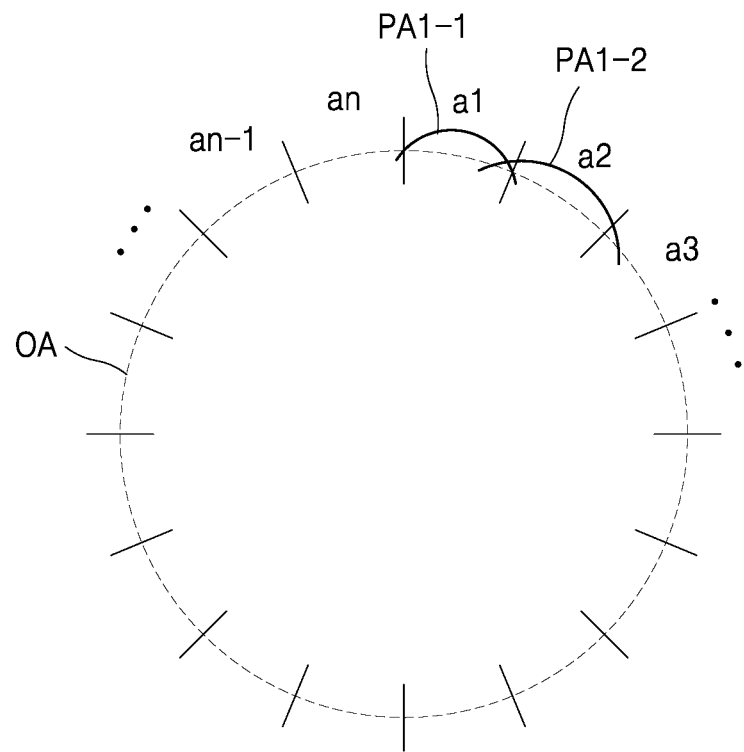
FIGS. 4A and 4B are schematic views of another example of the processes of manufacturing the display apparatus of FIG. 3.
Figure 4B:
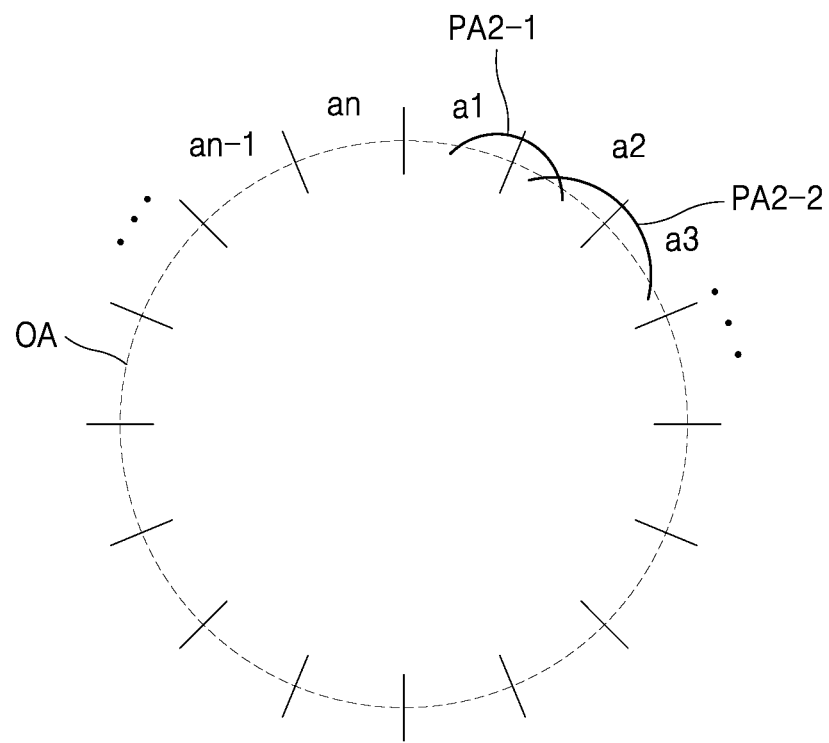

FIG. 3 is a schematic view of an example of processes of manufacturing a display apparatus, according to some example embodiments and FIGS. 4A and 4B are additional schematic views of a process of manufacturing the display apparatus of FIG. 3.

Referring to FIG. 3, according to the method of manufacturing the display apparatus according to some example embodiments, an opening may be formed in the opening area OA through a preparation operation S0, a first operation S1, a second operation S2, a third operation S3, a fourth operation S4, . . . , and a $2n^{th}$ operation S2n.

Here, the opening may be formed after all of the components (e.g., the thin film transistor TFT, the storage capacitor Cst, the pixel electrode 221, the intermediate layer 222, the opposite electrode 223, etc.) of the display apparatus 10 illustrated in FIG. 2 are formed.

Before directly forming the opening, the preparation operation S0 may be performed. In this operation, the opening area OA pre-set on the substrate 100 may be divided into a plurality of unit areas a1, a2, a3, . . . , an−1, and an. Here, the number n, into which the opening area OA is divided, is a natural number equal to or greater than 2.

The opening area OA may be an area surrounded by the display area (DA of FIG. 1) in which a plurality of display devices are formed and an area to be later removed by a laser process, as described above with reference to FIG. 1., etc. Accordingly, like the first opening 10H illustrated in FIG. 2, an opening penetrating the layers from the substrate 100 to the thin film encapsulation layer 300 in the thickness direction (the −z direction of FIG. 2) of the substrate 100 may be formed.

Thereafter, processes of scanning an edge of the opening area OA along a pre-set path may be performed by using the laser beam (LB of FIG. 2).

First, as shown in the first operation S1, a plurality of first unit paths PA1 may be set with respect to the plurality of unit areas a1, a2, a3, . . . , an−1, and an, respectively, which are divided in the previous preparation operation S0. Here, the plurality of first unit paths PA1 may be set to respectively correspond to the plurality of unit areas a1, a2, a3, . . . , an−1, and an, which are divided.

Each of the plurality of first unit paths PA1 may include a portion overlapping the edge of the opening area OA.

Accordingly, the plurality of first unit paths PA1 may be gathered to form a curved line having the same (or substantially the same) shape as the edge of the opening area OA.

According to some example embodiments, each of the plurality of first unit paths PA1 may have an arc shape. As illustrated in FIG. 3, neighboring first unit paths PA1 among the plurality of first unit paths PA1 may be set to partially overlap each other. However, embodiments are not necessarily limited thereto, and the neighboring first unit paths among the plurality of first unit paths PA1 may be set to be apart from each other.

As described above, along the plurality of first unit paths PA1 that are set, the laser beam (LB of FIG. 2) may be irradiated onto the edge of the opening area OA in a direction of the substrate (100 of FIG. 2). Here, the laser beam may sequentially move in a first scan direction D1 along the plurality of first unit paths PA1, and may be irradiated onto the separate unit areas a1, a2, a3, . . . , an−1, and an, along the respective first unit paths PA1, by moving in a second scan direction D2 corresponding to the first direction D1. After the laser beam LB has traveled around the edge of the opening area OA as described above, a first scan operation may be completed.

In the first scan operation, the second scan direction D2 with respect to the respective first unit paths PA1 and the first scan direction D1 with respect to the plurality of first unit paths PA1 may be set to substantially correspond to each other, to efficiently perform the operation of irradiating the laser beam LB.

Meanwhile, when the laser beam LB moves to a next unit path from a previous unit path from among the first unit paths PA1, the laser beam LB may be discontinuously irradiated. In other words, when the laser beam LB moves from the previous first unit path PA1 to the directly next first unit path PA2, a point in time in which the irradiation of the laser beam LB along the previous first unit path PA1 is completed may be different from a point in time in which the irradiation of the laser beam LB along the next first unit path PA2 is started.

Next, as shown in the second operation S2, a plurality of second unit paths PA2 may be set with respect to the plurality of unit areas a1, a2, a3, . . . , an−1, and an, respectively. Here, the plurality of second unit paths PA2 may be set to correspond to the plurality of unit areas a1, a2, a3, . . . , an−1, and an, respectively, and may have different paths from the plurality of first unit paths PA1.

According to some example embodiments, each of the plurality of second unit paths PA2 may be set in an area between neighboring first unit paths PA1.

Each of the plurality of second unit paths PA2 may also include a portion overlapping the edge of the opening area OA. Accordingly, the plurality of second unit paths PA2 may be gathered to form a curved line having substantially the same shape as the edge of the opening area OA.

According to some example embodiments, the plurality of second unit paths PA2 may be the paths having the same shape as those of the plurality of first unit paths PA1. Accordingly, when each of the plurality of first unit paths PA1 has a shape of an arc, each of the plurality of second unit paths PA2 may also have the shape of the arc.

According to some example embodiments, as illustrated in the $2n^{th}$ operation S2n, which is the final operation in the process of forming the opening, a point MP in which neighboring first unit paths PA1 among the plurality of first unit paths PA1 cross each other may pass through a vertical bisectional line V of the second unit path PA2 located between the neighboring first unit paths PA1.

Like the plurality of first unit paths PA1, neighboring second unit paths PA2 among the plurality of second unit paths PA2 may be set to partially overlap each other. However, embodiments are not necessarily limited thereto. The neighboring second unit paths PA2 among the plurality of second unit paths PA2 may be set to be apart from each other.

The laser beam (LB of FIG. 2) may be irradiated onto the edge of the opening area OA in the direction of the substrate (100 of FIG. 2) along the plurality of second unit paths PA2 that are set as described above. Here, the laser beam LB may sequentially move in the first scan direction D1 along the plurality of second unit paths PA2, and the laser beam LB may be irradiated onto the separate unit areas a1, a2, a3, . . . , an−1, and an, along the respective second unit paths PA2, by moving in the second scan direction D2 corresponding to the first scan direction D1. After the laser beam LB traveled around the edge of the opening area OA as described above, a second scan operation may be completed.

In the second scan operation, the second scan direction D2 with respect to the respective second unit paths PA2 and the first scan direction D1 with respect to the plurality of second unit paths PA2 may be set to substantially correspond to each other, to efficiently perform the operation of irradiating the laser beam LB.

Next, as shown in the third operation S3, the laser beam LB may be irradiated onto the edge of the opening area OA in the direction of the substrate, along the plurality of first unit paths PA1 set in the first operation S1. That is, in the third operation S3, the first scan operation of the first operation S1 may just be repeated.

Next, as shown in the fourth operation S4, the laser beam LB may be irradiated onto the edge of the opening area OA in the direction of the substrate, along the plurality of second unit paths PA2 set in the second operation S2. That is, in the fourth operation S4, the second scan operation of the second operation S2 may just be repeated.

Thereafter, the first scan operation of the first operation S1 and the second scan operation of the second operation S2 may be alternately and repeatedly performed. Here, because the plurality of first unit paths PA1, which are the scan paths of the first scan operation, are different from the plurality of second unit paths PA2, which are the scan paths of the second scan operation, a scan operation of the second scan operation may be performed by avoiding at least a portion of an area scanned in the previous first scan operation. Accordingly, at least a portion of a process region of the first scan operation may have the effect of a delay time during the second scan operation, and thus, thermal effects or thermal damage to the process region may be minimized.

After alternately and repeatedly performing the first scan operation and the second scan operation as described above, the edge of the opening area OA may be cut, as shown in the $2n^{th}$ operation S2n. Accordingly, the opening (10H of FIG. 2) penetrating the layers from the substrate (100 of FIG. 2) to the thin film encapsulation layer (300 of FIG. 2) in the thickness direction (the −z direction of FIG. 2) of the substrate (100 of FIG. 2) may be formed in the opening area (OA of FIG. 1) of the display apparatus (10 of FIG. 1).

Meanwhile, FIG. 3 illustrates that each of the plurality of first unit paths PA1 has a same certain shape and a same certain length and each of the plurality of second unit paths PA2 has a same certain shape and a same certain length. However, embodiments are not limited thereto.

According to another embodiment, the plurality of first unit paths PA1 may include at least two unit paths PA1-1 and PA1-2 having different lengths or different shapes from each other, as illustrated in FIG. 4A.

For example, the plurality of first unit paths PA1 may include a first-first unit path PA1-1 and a first-second unit path PA1-2, wherein the first-first unit path PA1-1 and the first-second unit path PA1-2 may have a different length or a different shape from each other.

As described above, because the display area (DA of FIG. 2) is arranged around the opening area (OA of FIG. 2), there may be a portion of the opening area OA, particularly for which thermal effects have to be minimized based on locations of components provided in the display area DA. For example, thermal effects due to the laser process have to be minimized for the portion of the opening area OA, the portion being adjacent to an organic layer included in the display area DA or to a micro-patterned portion.

Thus, in the portion of the opening area OA, for which the thermal effects have to be minimized, the scan path of the laser beam may be set as the first-first unit path PA1-1 which is relatively short, and in other portions of the opening area OA, the scan path of the laser beam may be set as the first-second unit path PA1-2 which is relatively long. By doing so, when forming the opening by using the laser beam, the thermal damage or the occurrence of cracks may be prevented or reduced in the display area DA around the opening area OA.

Likewise, the plurality of second unit paths PA2 may include a second-first unit path PA2-1 and a second-second unit path PA2-2 having different lengths or different shapes from each other as illustrated in FIG. 4B.

Figure 5:
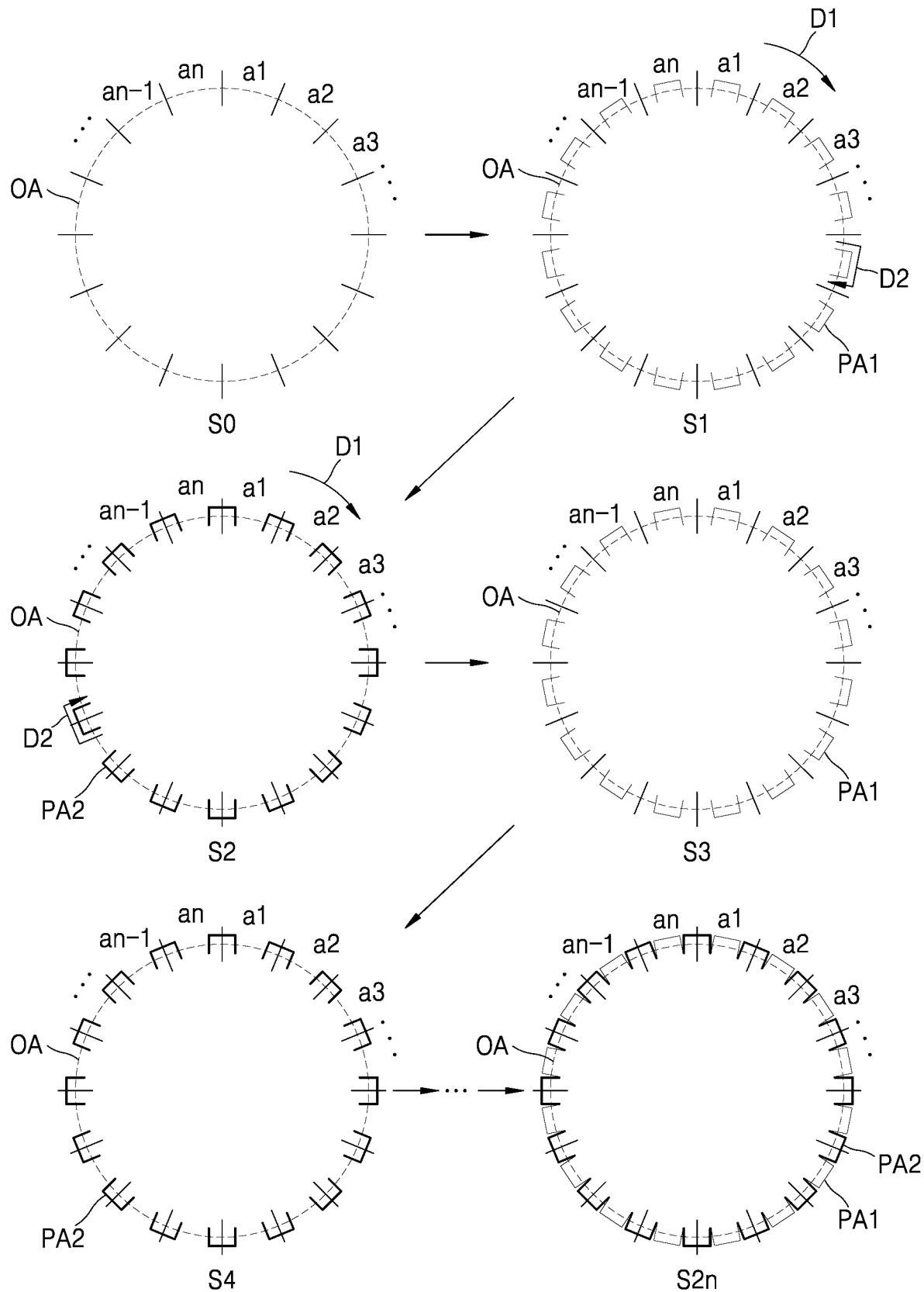
FIG. 5 is a schematic view of an example of processes of manufacturing a display apparatus, according to some example embodiments.
Figure 6:
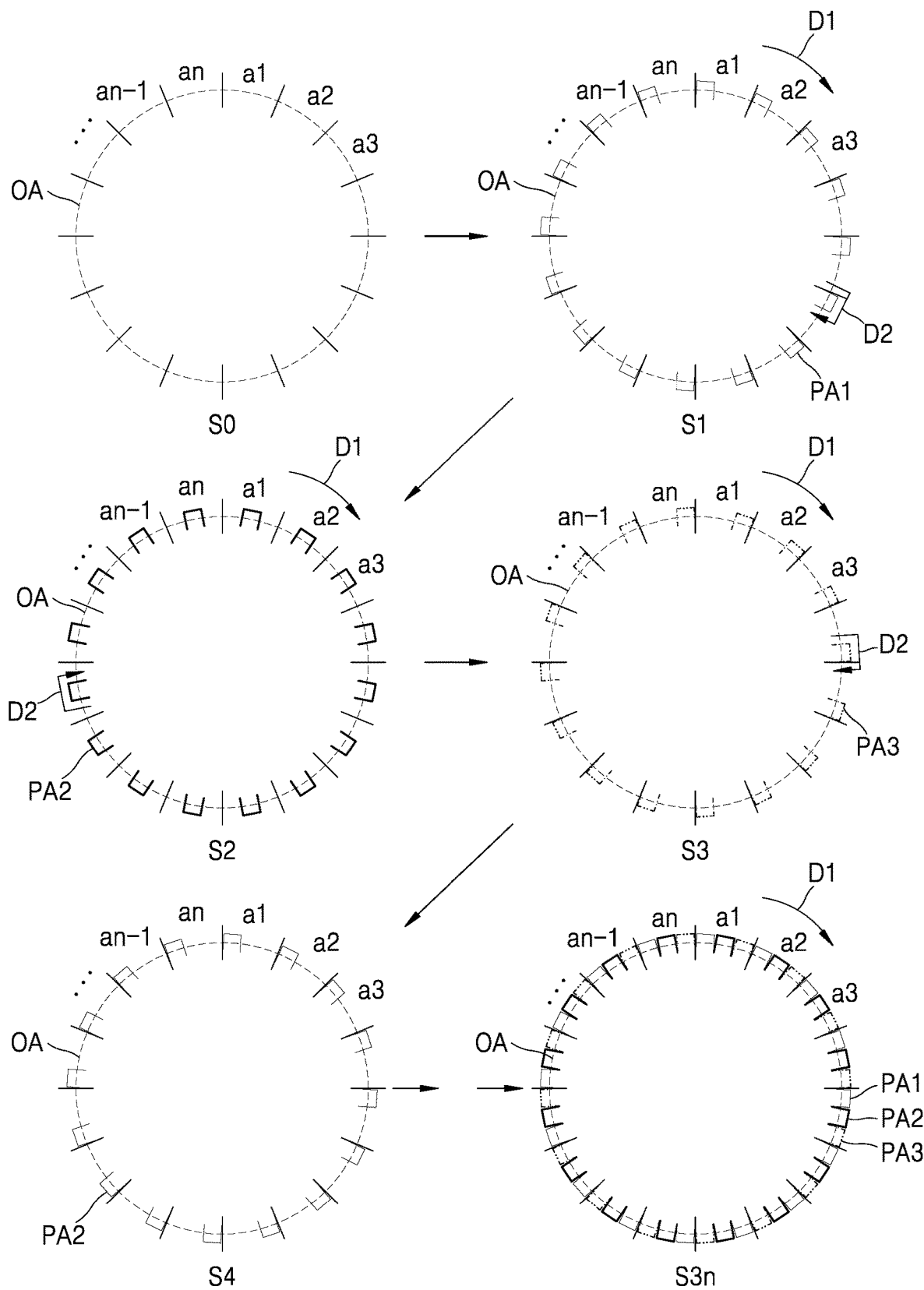
FIG. 6 is a schematic view of an example of processes of manufacturing a display apparatus, according to some example embodiments.

FIG. 5 is a schematic view of an example of processes of manufacturing a display apparatus, according to some example embodiments, and FIG. 6 is a schematic view of an example of processes of manufacturing a display apparatus, according to another embodiment.

First, the method of manufacturing the display apparatus illustrated in FIG. 5 includes the same or substantially the same processes and orders as the method of manufacturing the display apparatus illustrated in FIG. 3, while differing from the method of manufacturing the display apparatus illustrated in FIG. 3 in terms of a shape of unit paths, etc. Thus, hereinafter, the method of manufacturing the display apparatus according to some example embodiments will be described by focusing on aspects that are different from those of the method of manufacturing the display apparatus (hereinafter, referred to as the "previous embodiment") illustrated in FIG. 3.

According to some example embodiments, like the embodiment illustrated in FIG. 3, the opening may be formed in the opening area OA through the preparation operation S0, the first operation S1, the second operation S2, the third operation S3, the fourth operation S4, . . . , and the $2n^{th}$ operation S2n.

Here, the opening may be formed after all of the components (e.g., the thin film transistor TFT, the storage capacitor Cst, the pixel electrode 221, the intermediate layer 222, the opposite electrode 223, etc.) of the display apparatus 10 illustrated in FIG. 2 are formed, which is the same as the embodiment described above with reference to FIG. 3.

First, before directly forming the opening, the preparation operation S0 may be performed. In this operation, the opening area OA pre-set on the substrate 100 may be divided into a plurality of unit areas a1, a2, a3, . . . , an−1, and an. Here, the number n, into which the opening area OA is divided, is a natural number equal to or greater than 2.

Thereafter, as shown in the first operation S1, a plurality of first unit paths PA1 may be set with respect to the plurality of unit areas a1, a2, a3, . . . , an−1, and an, respectively, which are divided in the previous preparation operation S0. Here, the plurality of first unit paths PA1 may be set to respectively correspond to the plurality of unit areas a1, a2, a3, . . . , an−1, and an, which are divided.

Here, unlike the previous embodiment, each of the plurality of first unit paths PA1 may have at least a portion having a bent shape.

According to some example embodiments, each of the plurality of first unit paths PA1 may have a shape connecting three sides of a square. However, it is not necessarily limited thereto, and each of the plurality of first unit paths PA1 may have a shape connecting two sides of a triangle or a shape connecting one or more sides of a polygon.

When the plurality of first unit paths PA1 are set to have the shape connecting one or more sides of a polygon as described above, a width of an area of each of the unit areas a1, a2, a3, . . . , an−1, and an, the area being scanned by the laser beam, may be reduced. Thus, a size of the area processed by a single scan operation may be reduced so that the number of repeated scan operations may be increased. That is, the number of repeated micro-processing operations may be increased to further increase the process quality.

Accordingly, the plurality of first unit paths PA1 may be set to be apart from each other. However, the possibility that the plurality of first unit paths PA1 overlap each other is not excluded.

When the laser beam (LB of FIG. 2) is irradiated onto an edge of the opening area OA in a direction of the substrate (100 of FIG. 2) along the plurality of first unit paths PA1 set as described above and the laser beam travels around the edge of the opening area OA, a first scan operation may be completed. In the first scan operation, a second scan direction D2 with respect to the respective first unit paths PA1 and the first scan direction D1 with respect to the plurality of first unit paths PA1 may be set to partially correspond to each other, to efficiently perform the operation of irradiating the laser beam LB.

According to some example embodiments, when the laser beam LB moves to a next unit path from a previous unit path from among the first unit paths PA1, the laser beam LB may be discontinuously irradiated. In other words, when the laser beam LB moves from the previous first unit path PA1 to the directly next first unit path PA2, a point in time in which the irradiation of the laser beam LB along the previous first unit path PA1 is completed may be different from a point in time in which the irradiation of the laser beam LB along the next first unit path PA2 is started.

Next, as shown in the second operation S2, a plurality of second unit paths PA2 may be set with respect to the plurality of unit areas a1, a2, a3, . . . , an−1, and an, respectively. Here, the plurality of second unit paths PA2 may be set to correspond to the plurality of unit areas a1, a2, a3, . . . , an−1, and an, respectively, and may have different paths from the plurality of first unit paths PA1.

According to some example embodiments, each of the plurality of second unit paths PA2 may be set in an area between neighboring first unit paths PA1. Here, each of the plurality of second unit paths PA2 may have a shape that is bent and connecting one or more sides of a polygon, and may be set to be apart from each other.

The laser beam (LB of FIG. 2) may be irradiated onto the edge of the opening area OA in the direction of the substrate (100 of FIG. 2) along the plurality of second unit paths PA2 set as described above. Thereafter, when the laser beam has traveled around the edge of the opening area OA, a second scan operation may be completed.

Next, the first scan operation of the first operation S1 and the second scan operation of the second operation S2 may be alternately and repeatedly performed through the third operation S3, the fourth operation S4, etc. Here, because the plurality of first unit paths PA1, which are the scan paths of the first scan operation, are different from the plurality of second unit paths PA2, which are the scan paths of the second scan operation, a scan operation of the second scan operation may be performed by avoiding at least a portion of an area scanned in the previous first scan operation.

According to some example embodiments, an overlapping area between the plurality of first unit paths PA1 and the plurality of second unit paths PA2 may be less compared to alternative embodiments, and thus, the effect of a delay time in a process region of the first scan operation during the second scan operation may be increased.

After alternately and repeatedly performing the first scan operation and the second scan operation as described above, the edge of the opening area OA may be cut as shown in the $2n^{th}$ operation S2n. Accordingly, the opening (10H of FIG. 2) penetrating the layers from the substrate (100 of FIG. 2) to the thin film encapsulation layer (300 of FIG. 2) in the thickness direction (the $-z$ direction of FIG. 2) of the substrate (100 of FIG. 2) may be formed in the opening area (OA of FIG. 1) of the display apparatus (10 of FIG. 1).

Meanwhile, according to some example embodiments, the plurality of first unit paths PA1 and the plurality of second unit paths PA2 may have at least two unit paths having different lengths or shapes from each other.

Next, the method of manufacturing the display apparatus according to the embodiment illustrated in FIG. 6 differs from the method of manufacturing the display apparatus according to the embodiment illustrated in FIG. 5 in terms of the number of unit paths, etc.

For example, according to the embodiment illustrated in FIG. 6, a plurality of third unit paths PA3 are further set in addition to the plurality of first unit paths PA1 and the plurality of second unit paths PA2, and thus, unlike the embodiments illustrated in FIG. 3 and FIG. 5, the total scan operations may be 3n times.

Here, a first scan operation of the first operation S1, a second scan operation of the second operation S2, and a third scan operation of the third operation S3 may be alternately and repeatedly performed, and the alternation order may be the first scan operation, the second scan operation, and the third scan operation, or the first through third scan operations may be randomly performed.

The plurality of third unit paths PA3 may have different paths from the plurality of first unit paths PA1 and the plurality of second unit paths PA2, and thus, the effect of a delay time in a process region of a previous scan operation during a next scan operation may be greater than that of the embodiment illustrated in FIG. 5.

However, the number of scan operations is not limited to 3n and may be increased to 4n, 5n, etc., based on the size of the opening formed, the degree in which thermal effects have to be prevented, etc.

As described above, in a method of manufacturing the display apparatus according to some example embodiments, delay times may be decreased during the process operation, and thus, the production yield rate and the production quantity may be increased while the thermal damage or the occurrence of cracks may be reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by one of ordinary skill in the art that various changes in form and details may be made therein without departing from the spirit and scope as defined by the following claims, and their equivalents.

What is claimed is:

1. A method of manufacturing a display apparatus, the method comprising:
   forming a plurality of display devices in a display area of a substrate including an opening area, the display area surrounding the opening area; and
   forming an opening in the opening area,
   wherein the forming of the opening comprises:
   performing a first scan operation, whereby a laser beam is irradiated onto an edge of the opening area and the laser beam is moved during irradiation in a direction of the substrate along a plurality of first unit paths having a radius smaller than a radius of the opening, wherein the first scanning operation is completed by traveling around overlapping ones of the first unit paths at the edge of the opening area; and
   performing a second scan operation, whereby the laser beam is irradiated onto the edge of the opening area and the laser beam is moved during irradiation in the direction of the substrate along a plurality of second unit paths that are different from the plurality of first unit paths, wherein the second scanning operation is completed by traveling around overlapping ones of the second unit paths at the same edge of the opening area after the completion of the first scanning operation.

2. The method of claim 1, wherein the forming of the opening comprises alternately and repeatedly performing the first scan operation and the second scan operation.

3. The method of claim 1, wherein, in at least one of the first scan operation or the second scan operation, a point in time in which the irradiation of the laser beam along a previous unit path of neighboring unit paths is completed is different from a point in time in which the irradiation of the laser beam along a next unit path of the neighboring unit paths is started.

4. The method of claim 1, wherein each of the plurality of first unit paths and the plurality of second unit paths has at least a portion overlapping the edge of the opening area.

5. The method of claim 1, wherein the plurality of first unit paths and the plurality of second unit paths have a same shape.

6. The method of claim 5, wherein a point in which neighboring first unit paths among the plurality of first unit paths cross each other passes through a vertical bisectional line of a second unit path among the plurality of second unit paths, the second unit path being located between the neighboring first unit paths.

7. The method of claim 1, wherein at least one of the plurality of first unit paths or the plurality of second unit paths has an arc shape.

8. The method of claim 1, wherein at least one of the plurality of first unit paths or the plurality of second unit paths has at least a portion having a bent shape.

9. The method of claim 1, wherein at least one of the plurality of first unit paths or the plurality of second unit paths comprises at least two unit paths having different lengths from each other.

10. The method of claim 1, wherein the forming of the opening further comprises performing a third scan operation, whereby the laser beam is irradiated onto the edge of the opening area in the direction of the substrate along a plurality of third unit paths that are different from the plurality of first unit paths and the plurality of second unit paths.

11. The method of claim 1, further comprising
forming a thin film encapsulation layer on the substrate to cover the plurality of display devices.

12. The method of claim 11, wherein the forming of the opening comprises forming the opening to penetrate the substrate and the thin film encapsulation layer in a thickness direction of the substrate.

13. The method of claim 1, wherein the forming of the plurality of display devices comprises:
forming a pixel circuit comprising a thin film transistor;
forming a pixel electrode electrically connected to the thin film transistor; and
forming an emission layer on the pixel electrode and an opposite electrode on the emission layer.

14. A method of manufacturing a display apparatus, the method comprising:
forming a plurality of display devices in a display area of a substrate comprising an opening area, the display area surrounding the opening area; and
forming an opening in the opening area,
wherein the forming of the opening in the opening area comprises:
repeatedly performing a first scan operation n times, whereby a laser beam is irradiated onto an edge of the opening area and the laser beam is moved during irradiation in a direction of the substrate along n (n is a natural number equal to or greater than 2) first unit paths having a radius smaller than a radius of the opening wherein the first scanning operation is completed by traveling around overlapping ones of the first unit paths at the edge of the opening area; and
repeatedly performing a second scan operation n times, whereby the laser beam is irradiated onto the edge of the opening and the laser beam is moved during irradiation in the direction of the substrate along n second unit paths that are different from the n first unit paths wherein the second scanning operation is completed by traveling around overlapping ones of the second unit paths at the same edge of the opening area after the completion of the first scanning operation.

15. The method of claim 14, wherein the forming of the opening in the opening area comprises alternately and repeatedly performing the first scan operation and the second scan operation.

16. The method of claim 14, wherein, in at least one of the first scan operation or the second scan operation, a point in time in which the irradiation of the laser beam along a previous unit path of neighboring unit paths is completed is different from a point in time in which the irradiation of the laser beam along a next unit path of the neighboring unit paths is started.

17. The method of claim 14, wherein each of the n first unit paths and the n second unit paths has at least a portion overlapping the edge of the opening area.

18. The method of claim 14, wherein the n first unit paths and the n second unit paths have a same shape.

19. The method of claim 14, wherein at least one of the n first unit paths or the n second unit paths comprises at least two unit paths having different lengths from each other.

20. The method of claim 14, wherein the forming of the opening further comprises performing a third scan operation, whereby the laser beam is irradiated onto the edge of the opening area in the direction of the substrate along n third unit paths that are different from the n first unit paths and the n second unit paths.

* * * * *